(12) United States Patent
Choo

(10) Patent No.: US 10,796,772 B2
(45) Date of Patent: Oct. 6, 2020

(54) SEMICONDUCTOR MEMORY DEVICE AND METHOD FOR OPERATING THE SAME

(71) Applicant: SK hynix Inc., Gyeonggi-do (KR)

(72) Inventor: Heon Jin Choo, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/657,365

(22) Filed: Oct. 18, 2019

(65) Prior Publication Data

US 2020/0051645 A1 Feb. 13, 2020

Related U.S. Application Data

(62) Division of application No. 16/050,096, filed on Jul. 31, 2018, now Pat. No. 10,490,287.

(30) Foreign Application Priority Data

Dec. 27, 2017 (KR) ........................ 10-2017-0181079

(51) Int. Cl.
*G11C 16/28* (2006.01)
*G11C 16/26* (2006.01)
*G11C 16/04* (2006.01)

(52) U.S. Cl.
CPC .......... *G11C 16/28* (2013.01); *G11C 16/0458* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 8,510,636 | B2 * | 8/2013 | Ruby | H03M 13/6325 714/773 |
| 2006/0227619 | A1 * | 10/2006 | Honda | G11C 11/5642 365/185.22 |
| 2008/0144388 | A1 * | 6/2008 | Yamashita | G11C 16/28 365/185.22 |
| 2009/0067227 | A1 * | 3/2009 | Kang | G11C 13/004 365/163 |
| 2010/0103735 | A1 * | 4/2010 | Kim | G11C 16/26 365/185.03 |
| 2014/0226398 | A1 * | 8/2014 | Desireddi | G11C 16/3436 365/185.03 |
| 2017/0365336 | A1 * | 12/2017 | Lin | G11C 13/004 |
| 2018/0137913 | A1 * | 5/2018 | Kim | G11C 13/004 |

* cited by examiner

*Primary Examiner* — Tan T. Nguyen
(74) *Attorney, Agent, or Firm* — IP & T Group LLP

(57) ABSTRACT

A semiconductor memory device includes a memory cell array, a peripheral circuit, and a control logic. The memory cell array includes a plurality of memory blocks. The peripheral circuit performs a read operation on a selected memory block among the plurality of memory blocks. The control logic controls the read operation of the peripheral circuit. The selected memory block is coupled to a plurality of bit lines, and the plurality of bit lines are grouped into a plurality of bit line groups. The peripheral circuit performs data sensing by applying different reference currents to the plurality of bit line groups, respectively.

9 Claims, 14 Drawing Sheets

SEMICONDUCTOR MEMORY DEVICE AND METHOD FOR OPERATING THE SAME

CROSS-REFERENCE TO RELATED APPLICATION

This application is a division of U.S. patent application Ser. No. 16/050,096 filed on Jul. 31, 2018, which claims benefits of priority of Korean Patent Application No. 10-2017-0181079 filed on Dec. 27, 2017. The disclosure of each of the foregoing application is incorporated herein by reference in its entirety.

BACKGROUND

1. Field of Invention

Various exemplary embodiments of the present disclosure generally relate to an electronic device. Particularly, the embodiments relate to a semiconductor memory device and a method for operating the same.

2. Description of the Related Art

A memory device may be formed in a two-dimensional structure in which strings are arranged horizontally to a semiconductor substrate, or be formed in a three-dimensional structure in which strings are arranged vertically to a semiconductor substrate. A three-dimensional semiconductor memory device is designed to overcome the degree of integration limit in a two-dimensional semiconductor device, and may include a plurality of memory cells vertically stacked on a semiconductor substrate.

SUMMARY

Embodiments provide a semiconductor memory device having increased operating speed.

Embodiments also provide a method for operating a semiconductor memory device at increased operating speed.

According to an aspect of the present disclosure, there is provided a semiconductor memory device including: a memory cell array including a plurality of memory blocks; a peripheral circuit configured to perform a read operation on a selected memory block among the plurality of memory blocks; and a control logic configured to control the read operation of the peripheral circuit, wherein the selected memory block is coupled to a plurality of bit lines, and the plurality of bit lines are grouped into a plurality of bit line groups, wherein the peripheral circuit performs data sensing by applying different reference currents to the plurality of bit line groups, respectively.

The peripheral circuit may include: a first page buffer circuit coupled to a first bit line group among the plurality of bit line groups; and a second page buffer circuit coupled to a second bit line group among the plurality of bit line groups. The first page buffer circuit may perform data sensing, using a first reference current, and the second page buffer circuit may perform data sensing, using a second reference current different from the first reference current.

The first reference current may correspond to a first read voltage, and the second reference current may correspond to a second read voltage different from the first read voltage.

When a read operation of a selected page fails, the control logic may control the peripheral circuit to repeat the read operation by changing the first reference current and the second reference current.

According to an aspect of the present disclosure, there is provided a method for operating a semiconductor memory device, the method including: receiving a read command; performing a sensing operation on a plurality of memory cells, using a set of reference currents; determining whether a read operation has succeeded as a result of the sensing operation; and changing the set of reference currents, based on the determined result.

The changing of the set of reference currents, based on the determined result, may include: when the read operation fails, determining whether the number of times that the read operation has failed has reached a predetermined critical value; when the number of times that the read operation has failed has not reached the critical value, changing the set of reference currents; and performing the sensing operation on the plurality of memory cells, using the changed set of reference currents.

The set of reference currents may include a first reference current and a second reference current. The first reference current may correspond to a first read voltage, and the second reference current may correspond to a second read voltage different from the first read voltage.

According to an aspect of the present disclosure, there is provided a method for operating a semiconductor memory device, the method including: receiving a read command; performing a sensing operation on memory cells of a selected page, using a first reference current and a second reference current different from the first reference current; determining a third read voltage, based on a first sensing result using the first reference current and a second sensing result using the second reference current; and performing the sensing operation on the memory cells, based on the third read voltage.

The first sensing result may include a number of bit errors detected as a result of the sensing operation using the first reference current, and the second sensing result may include a number of bit errors detected as a result of the sensing operation using the second reference current.

The first reference current may correspond to a first read voltage, the second reference current may correspond to a second read voltage different from the first read voltage, and a third reference current may correspond to the third read voltage.

The method may further include, when the sensing operation based on the third read voltage fails, performing the sensing operation on the memory cells by repeatedly performing sensing.

The performing of the sensing operation on the memory cells by repeatedly performing sensing may include: performing a sensing operation on a plurality of memory cells, using a set of reference currents; determining whether a read operation has succeeded as a result of the sensing operation; and changing the set of reference currents, based on the determined result.

The changing of the set of reference currents, based on the determined result, may include: when the read operation fails, determining whether the number of times that the read operation has failed has reached a predetermined critical value; when the number of times that the read operation has failed has not reached the critical value, changing the set of reference currents; and performing the sensing operation on the plurality of memory cells, using the changed set of reference currents.

The set of reference currents may include a fourth reference current and a fifth reference current different from the fourth reference current. The fourth reference current may correspond to a fourth read voltage, and the fifth reference current may correspond to a fifth read voltage different from the fourth read voltage.

BRIEF DESCRIPTION OF THE DRAWINGS

Various embodiments will now be described in more detail with reference to the accompanying drawings; however, elements and features of the present invention may be configured or arranged differently than shown or described herein. Thus, the present invention is not limited to the embodiments set forth herein. Rather, these embodiments are provided so that this disclosure is thorough and complete and fully conveys the scope of the embodiments to those skilled in the art. It is further noted that reference to "an embodiment" or the like is not necessarily to only one embodiment, and different references to "an embodiment" or the like is not necessarily to the same embodiment(s).

In the drawings, dimensions may be exaggerated for clarity. It is to be understood that when an element is referred to as being "between" two elements, it can be the only element between the two elements, or one or more intervening elements may also be present. Like reference numerals refer to like elements throughout this disclosure.

DETAILED DESCRIPTION

Figure 1:
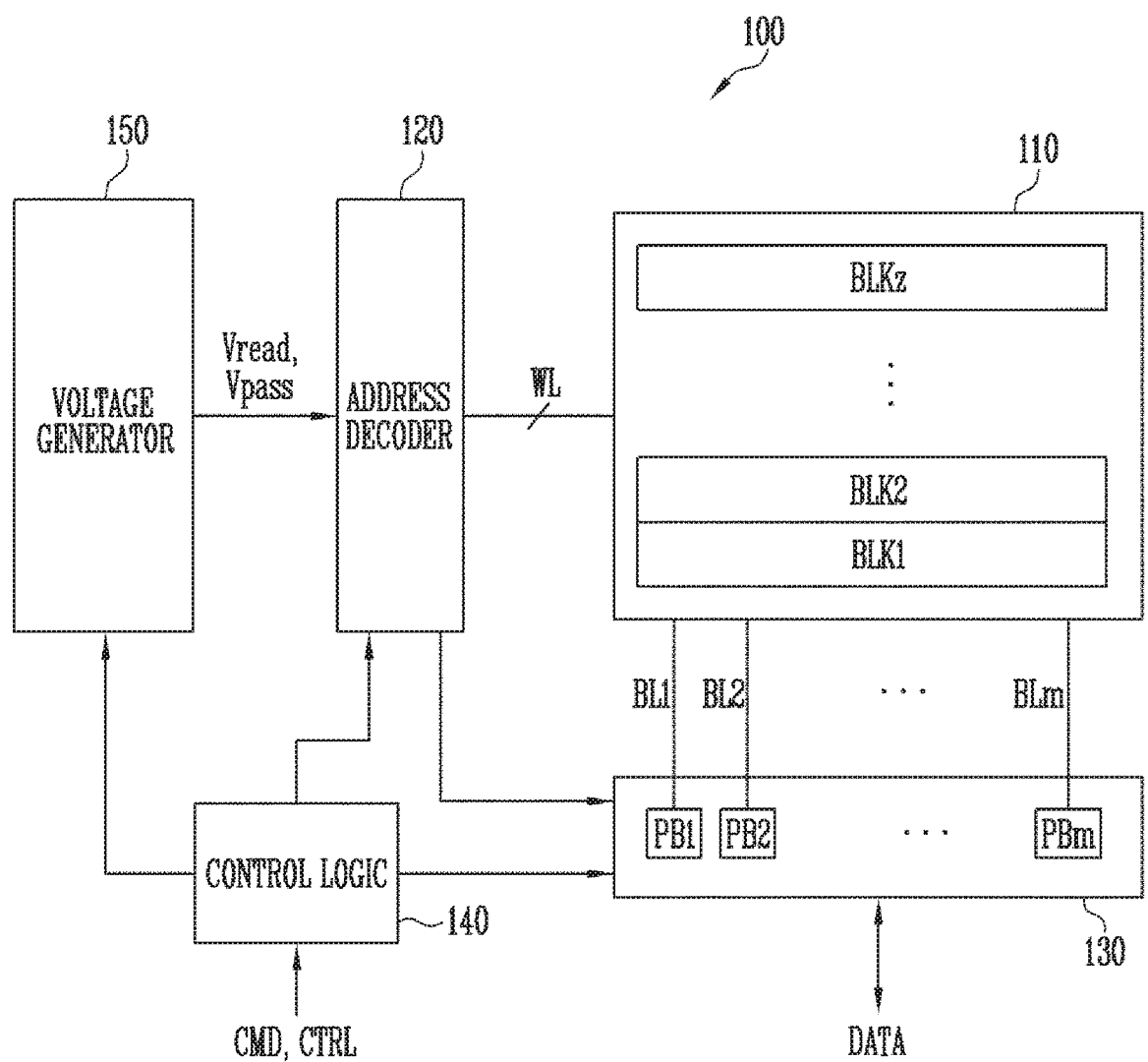
FIG. 1 is a block diagram illustrating a semiconductor memory device according to an embodiment of the present disclosure.

In the following detailed description, certain embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween.

Various embodiments of the present disclosure will be described in detail with reference to the accompanying drawings. The same reference numerals are used to designate the same elements throughout the drawings. In the following description, only detail necessary for understanding operations according to the embodiments may be presented; description of known material in related fields may be omitted to not obscure important concepts of the embodiments.

The terminology used herein is for the purpose of describing particular embodiments only and is not intended to be limiting of the present invention.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

FIG. 1 is a block diagram illustrating a semiconductor memory device according to an embodiment of the present disclosure.

Referring to FIG. 1, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz includes a plurality of memory cells. In an embodiment, the memory cells are nonvolatile memory cells, which may be configured as having a vertical channel structure. The memory cell array 110 may be configured as having a two-dimensional structure. In some embodiments, the memory cell array 110 may be configured as having a three-dimensional structure. Each of the plurality of memory cells in the memory cell array 110 may store data of at least one bit. In an embodiment, each of the memory cells may be a single-level cell (SLC) that stores data of one bit. In another embodiment, each of the memory cells may be a multi-level cell (MLC) that stores data of two bits. In still another embodiment, each of the memory cells may be a triple-level cell that stores data of three bits. In still another embodiment, each of the memory cells may be a quad-level cell that stores data of four bits. In some embodiments, the memory cell array 110 may include memory cells that each stores data of five or more bits.

The address decoder 120, the read/write circuit 130, the control logic 140, and the voltage generator 150 operate as a peripheral circuit, or control circuit, that drives the memory cell array 110. The address decoder 120 is coupled to the memory cell array 110 through the word lines WL. The address decoder 120 is configured to operate in response to the control of the control logic 140. The address decoder 120 receives an address through an input/output buffer (not shown) provided in the semiconductor memory device 100.

The address decoder 120 is configured to decode a block address in the received address. The address decoder 120 selects at least one memory block according to the decoded block address. In a read voltage application operation during a read operation, the address decoder 120 applies a read voltage Vread generated by the voltage generator 150 to a selected word line among the selected memory blocks, and applies a pass voltage Vpass to the other unselected word lines. In a program verify operation, the address decoder 120 applies a verify voltage generated by the voltage generator 150 to the selected word line among the selected memory blocks, and applies the pass voltage Vpass to the other unselected word lines.

The address decoder 120 may decode a column address in the received address. The address decoder 120 transmits the decoded column address to the read/write circuit 130.

Read and program operations of the semiconductor memory device 100 are performed in units of pages. An address received in a request of the read operation and the program operation includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation of the memory cell array 110, and operate as a "write circuit" in a write operation of the memory cell array 110. The plurality of page buffers PB1 to PBm are coupled to the memory cell array 110 through the bit lines BL1 to BLm. In order to sense threshold voltages of memory cells in the read operation and the program verify operation, the plurality of page buffers PB1 to PBm sense a change in amount of current flowing depending on a program state of a corresponding memory cell while continuously supplying sensing current to bit lines coupled to the memory cells, and latch the sensed change as sensing data. The read/write circuit 130 operates in response to page buffer control signals output from the control logic 140.

In the read operation, the read/write circuit 130 temporarily stores read data by sensing data of a memory cell and then outputs data DATA to the input/output buffer of the semiconductor memory device 100. In an embodiment, the read/write circuit 130 may include a column selection circuit, and the like, in addition to the page buffers (or page registers).

The control logic 140 is coupled to the address decoder 120, the read/write circuit 130, and the voltage generator 150. The control logic 140 receives a command CMD and a control signal CTRL through the input/output buffer of the semiconductor memory device 100. The control logic 140 may control overall operations of the semiconductor memory device 100 in response to the control signal CTRL. Also, the control logic 140 outputs a control signal for controlling sensing node precharge potential levels of the plurality of page buffers PB1 to PBm. The control logic 140 may control the read/write circuit 130 to perform the read operation of the memory cell array 110.

In the read operation, the voltage generator 150 generates the read voltage Vread and the pass voltage Vpass in response to a control signal output from the control logic 140. In order to generate a plurality of voltages having various voltage levels, the voltage generator 150 may include a plurality of pumping capacitors for receiving an internal power voltage, and generate a plurality of voltages by selectively activating the plurality of pumping capacitors under the control of the control logic 140.

Figure 2:
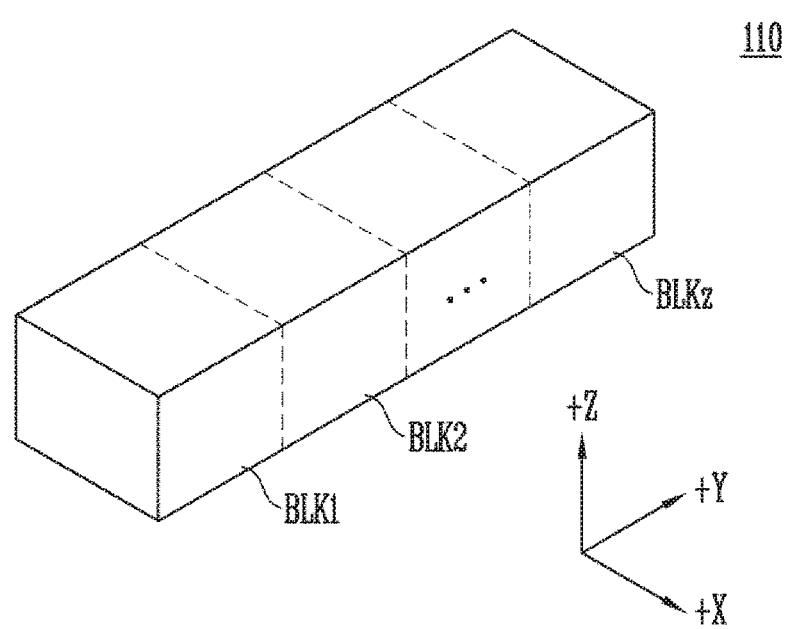
FIG. 2 is a diagram illustrating an embodiment of a memory cell array of FIG. 1.

FIG. 2 is a diagram illustrating an embodiment of the memory cell array of FIG. 1.

Referring to FIG. 2, the memory cell array 110 includes a plurality of memory blocks BLK1 to BLKz. Each memory block has a three-dimensional structure that includes a plurality of memory cells stacked above a substrate. The plurality of memory cells are arranged along +X, +Y, and +Z directions. The structure of each memory block will be described in more detail with reference to FIGS. 3 and 4.

Figure 3:
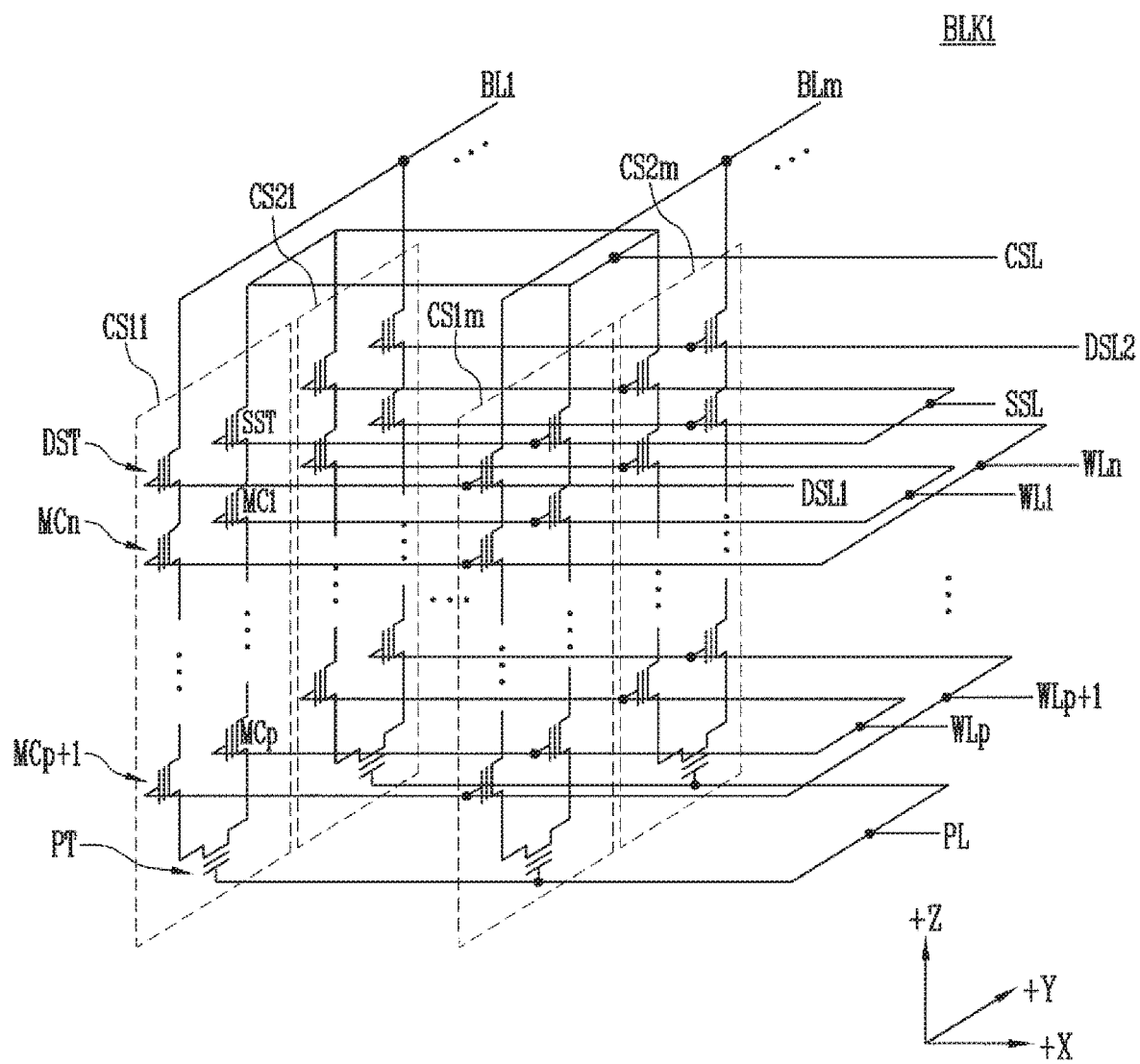
FIG. 3 is a circuit diagram illustrating an embodiment of one of the memory blocks of FIG. 2.

FIG. 3 is a circuit diagram illustrating an embodiment of one BLK1 among the plurality of memory blocks BLK1 to BLKz of FIG. 2.

Referring to FIG. 3, a first memory block BLK1 includes a plurality of cell strings CS11 to CS1$m$ and CS21 to CS2$m$. In the memory block BLK1, m cell strings are arranged in a row direction (i.e., a +X direction) and are coupled to first to mth bit lines BL1 to BLm, respectively. In addition, q cell strings (q is a natural number) are arranged in a column direction (i.e., a +Y direction). In FIG. 3, only two cell strings arranged in the column direction are illustrated for clarity.

Each of the plurality of cell strings CS11 to CS1$m$ and CS21 to CS2$m$ is formed in a 'U' shape. Each of the plurality of cell strings CS11 to CS1$m$ and CS21 to CS2$m$ includes a pipe transistor PT, memory cells MC1 to MCn, a source select transistor SST, and a drain select transistor DST, which are stacked above a substrate (not shown) at a lower portion of the memory block BLK1.

The select transistors SST and DST and the memory cells MC1 to MCn may have structures similar to one another. For example, each of the select transistors SST and DST and the memory cells MC1 to MCn may include a channel layer, a tunneling insulating layer, a charge storage layer, and a blocking insulating layer coupled to a corresponding row line.

The source select transistor SST of each cell string is coupled between a common source line CSL and memory cells MC1 to MCp. A gate of the source select transistor SST is commonly coupled to a source select line SSL.

First to nth memory cells MC1 to MCn of each cell string are coupled between the source select transistor SST and the drain select transistor DST.

The first to nth memory cells MC1 to MCn are divided into first to pth memory cells MC1 to MCp and (p+1)th to nth memory cells MCp+1 to MCn. The first to pth memory cells MC1 to MCp and the (p+1)th to nth memory cells MCp+1 to MCn are coupled to each other through the pipe transistor PT. The first to pth memory cells MC1 to MCp are sequentially arranged in the −Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. Gates of the first to nth memory cells MC1 to MCn are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. The drain select transistors DST of cell strings CS11 to CS1$m$ of a first row are coupled to a first drain select line DSL1. The drain select transistors DST of cell strings CS21 to CS2$m$ of a second row are coupled to a second drain select line DSL2.

Consequently, cell strings (e.g., CS11 to CS1$m$) arranged on the same row (i.e., in the +X direction) are coupled to the same drain select line (e.g., DSL1) through corresponding drain select transistors. Cell strings (e.g., CS11 and CS21) arranged on different rows are coupled to different drain select lines DSL1 and DSL2.

Cell strings commonly coupled to one bit line constitute one column. For example, the cell strings CS11 and CS21 commonly coupled to the first bit line BL1 may correspond to a first column. Similarly, the cell strings CS1$m$ and CS2$m$ commonly coupled to the mth bit line BL$m$ may correspond to an mth column. As shown in FIG. 3, the memory block BLK1 includes m columns, and each column includes two cell strings.

In addition, cell strings coupled to one drain select line constitute one row. For example, the cell strings CS11 to CS1$m$ coupled to the first drain select line DSL1 may correspond to a first row, and the cell strings CS21 to CS2$m$ coupled to the second drain select line DSL2 may correspond to a second row. As shown in FIG. 3, the memory block BLK1 includes two rows, and each row includes m cell strings.

Figure 4:
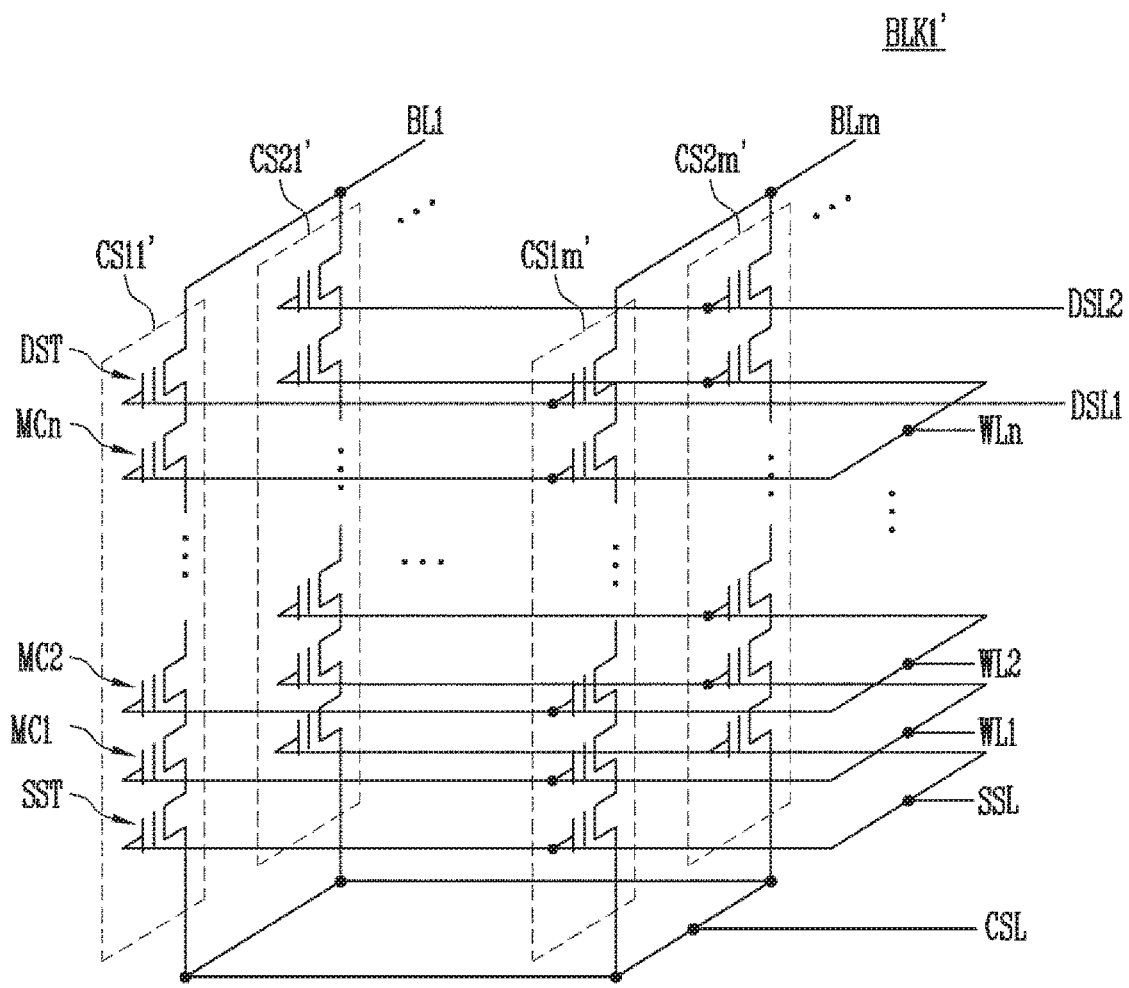
FIG. 4 is a circuit diagram illustrating another embodiment of one of the memory blocks of FIG. 2.

FIG. 4 is a circuit diagram illustrating another embodiment BLK1' of the one BLK1 among the plurality of memory blocks BLK1 to BLKz of FIG. 2.

Referring to FIG. 4, a first memory block BLK1' includes a plurality of cell strings CS11' to CS1$m$' and CS21' to CS2$m$''. In the first memory block BLK1', m cell strings are arranged in a row direction (i.e., a +X direction and are coupled to first to mth bit lines BL1 to BL$m$, respectively. In addition, q (q is a natural number) cell strings are arranged in a column direction (i.e., a +Y direction). In FIG. 4, only two cell strings arranged in the column direction are illustrated for clarity.

Each of the plurality of cell strings CS11' to CS1$m$' and CS21' to CS2$m$' extends along a +Z direction. Each of the plurality of cell strings CS11° to CS1$m$' and CS21' to CS2$m$' includes a source select transistor SST, first to nth memory cells MC1 to MCn, and a drain select transistor DST, which are stacked above a substrate (not shown) at a lower portion of the memory block BLK1'.

The source select transistor SST of each cell string is commonly coupled to a common source line CSL. The source select transistor SST of each cell string is coupled between the common source line CSL and the memory cells MC1 to MCn. A gate of the source select transistor SST of each cell string is coupled to a source select line SSL.

The first to nth memory cells MC1 to MCn of each cell string are coupled in series between the source select transistor SST and the drain select transistor DST. Memory cells arranged at the same height are coupled to the same word line. The first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged on the same row (i.e., in the +X direction) are coupled to the same drain select line. The drain select transistors DST of cell strings CS11' to CS1$m$' of a first row are coupled to a first drain select line DSL1. The drain select transistors DST of cell strings CS21' to CS2$m$' of a second row are coupled to a second drain select line DSL2.

Cell strings commonly coupled to one bit line constitute one column. For example, the cell strings CS11' and CS21' commonly coupled to the first bit line BL1 may correspond to a first column. Similarly, the cell strings CS1$m$' and CS2$m$' commonly coupled to the mth bit line BL$m$ may correspond to an mth column. As shown in FIG. 4, the memory block BLK1' includes m columns, and each column includes two cell strings.

In addition, cell strings coupled to one drain select line constitute one row. For example, the cell strings CS11' to CS1$m$' coupled to the first drain select line DSL1 may correspond to a first row, and the cell strings CS21' to CS2$m$' coupled to the second drain select line DSL2 may correspond to a second row. As shown in FIG. 4, the memory block BLK1' includes two rows, and each row includes m cell strings.

Consequently, the memory block BLK1' of FIG. 4 is similar to that of the memory block BLK1 of FIG. 3, except that the pipe select transistor PT is excluded from each cell string.

In FIG. 4, first to mth cell strings CS11' to CS1$m$' or CS21' to CS2$m$' arranged in the row direction are coupled to the first to mth bit lines BL1 to BL$m$, respectively. In another embodiment, even bit lines and odd bit lines may be provided instead of the first to mth bit lines BL1 to BL$m$. In addition, it will be understood that, among the cell strings CS11' to CS1$m$' or CS21' to CS2$m$' arranged in the row direction, even-numbered cell strings may be respectively coupled to the even bit lines and odd-numbered cell strings may be respectively coupled to the odd bit lines.

Figure 5:
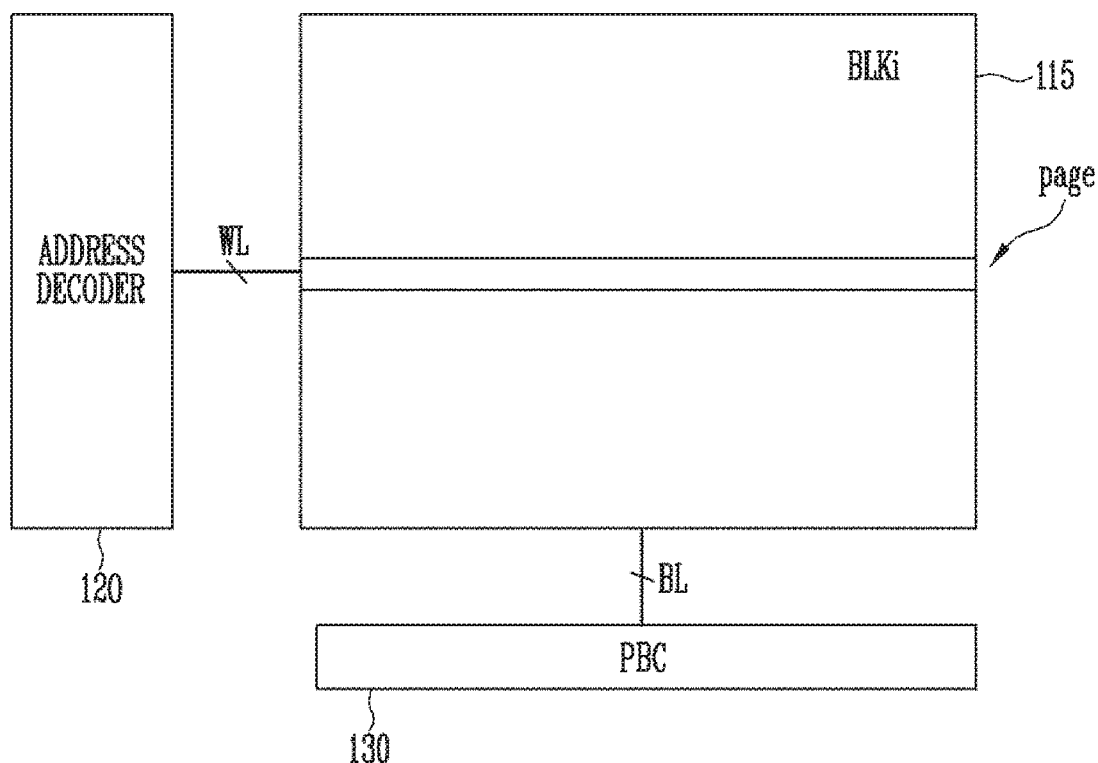
FIG. 5 is a block diagram illustrating a read operation of a typical semiconductor memory device.

FIG. 5 is a block diagram illustrating a read operation of a typical semiconductor memory device.

Referring to FIG. 5, among the components of the semiconductor memory device 100 shown in FIG. 1, a memory block BLKi 115 in the memory cell array 110, the address decoder 120, and the read/write circuit 130 are shown. The address decoder 120 performs a read operation by applying a read voltage to a word line WL coupled to a selected page of the memory block 115 and applying a read pass voltage to the other word lines.

The read/write circuit 130 is coupled to a bit line BL to perform a read operation on the selected page. To this end, the read/write circuit 130 may be configured as a page buffer circuit (PBC). In a state in which the threshold voltage distribution of memory cells is degraded, the read/write circuit 130 may determine an optimum read voltage by repeatedly performing threshold voltage sensing on memory cells of the page. A method for repeatedly performing threshold voltage sensing on memory cells will be described later with reference to FIG. 6.

Figure 6:
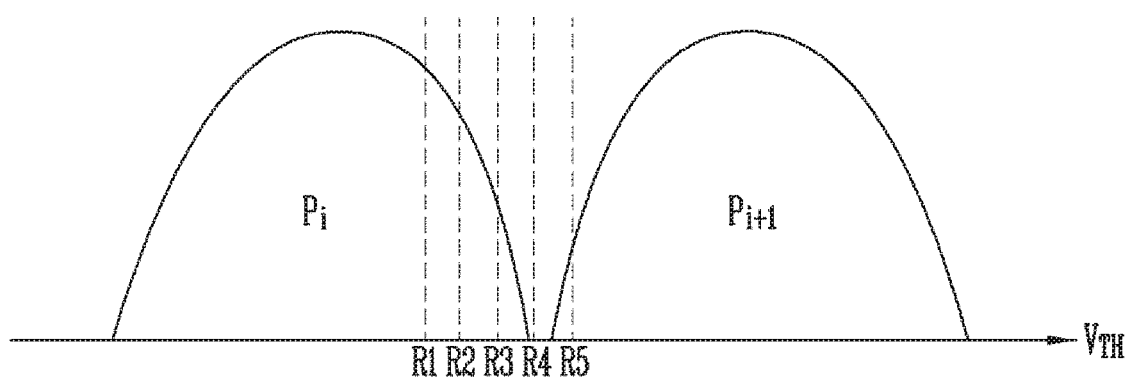
FIG. 6 is a diagram illustrating a method for determining an optimum read voltage by repeatedly performing threshold voltage sensing according to an embodiment of the present disclosure.

FIG. 6 is a diagram illustrating a method for determining an optimum read voltage by repeatedly performing threshold voltage sensing according to an embodiment of the present disclosure.

Referring to FIG. 6, there is illustrated a process of detecting an optimum read voltage between an ith program state $P_i$ and an (i+1)th program state $P_{i+1}$.

First, threshold voltages of memory cells are detected through a first read voltage R1. As shown in FIG. 6, there is a plurality of memory cells having threshold voltages larger than the first read voltage R1 among memory cells corresponding to the ith program state $P_i$. Therefore, when the threshold voltages of the memory cells are detected through the first read voltage R1, a plurality of bit errors may occur.

Subsequently, threshold voltages of memory cells are detected through a second read voltage R2. In this case, a small number of bit errors may occur as compared with when the threshold voltages of the memory cells are detected through the first read voltage R1. Similarly, when threshold voltages of memory cells are detected through a third read voltage R3, the number of bit errors may be further decreased. When threshold voltages of memory cells are detected through a fourth read voltage R4, no bit error may occur. However, when threshold voltages of memory cells are detected through a fifth read voltage R5, bit errors may occur again.

Figure 7:
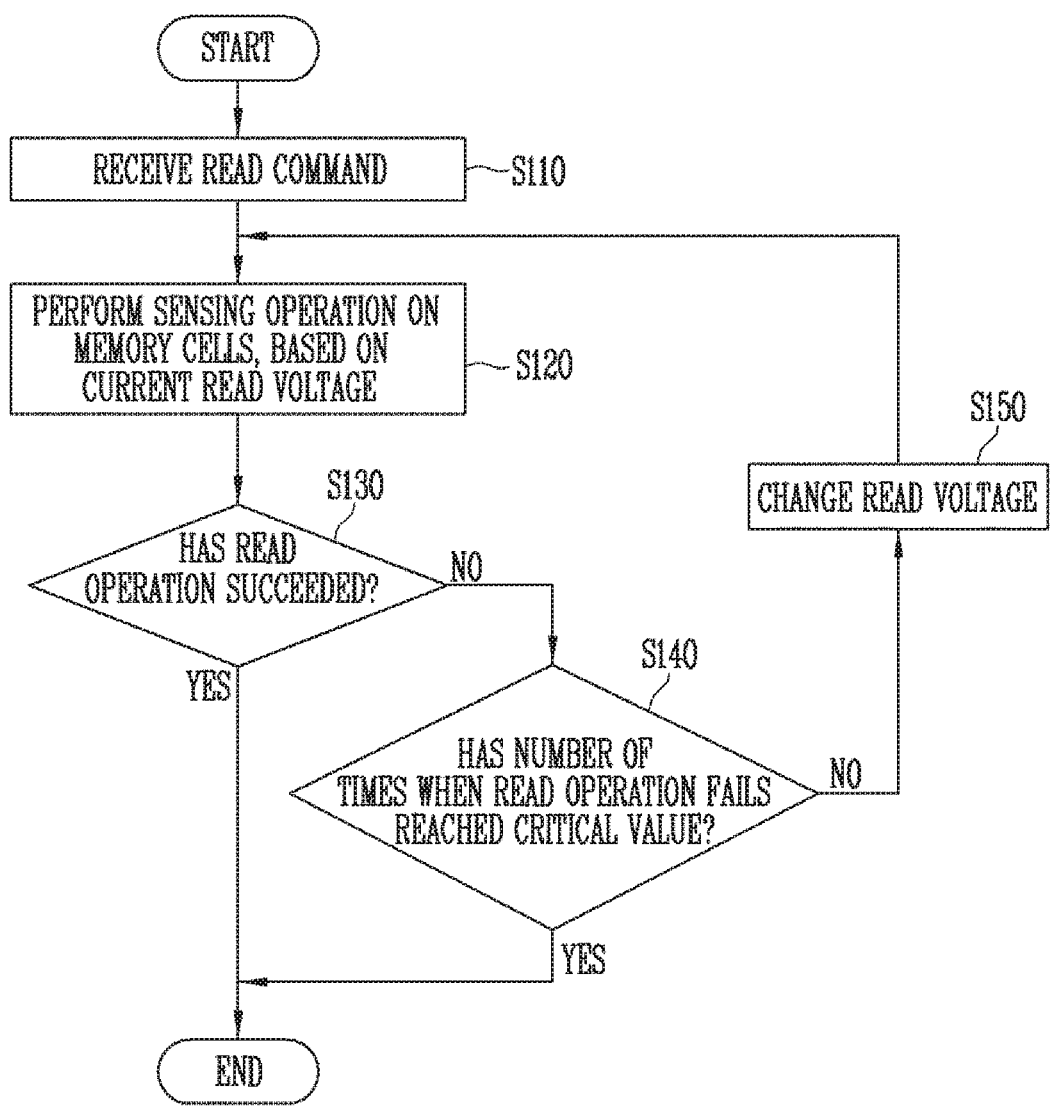
FIG. 7 is a flowchart describing a method for determining an optimum read voltage by repeatedly performing threshold voltage sensing according to an embodiment of the present disclosure.

FIG. 7 is a flowchart describing a method for determining an optimum read voltage by repeatedly performing threshold voltage sensing according to an embodiment of the present disclosure.

Referring to FIG. 7, a read command is received at step S110, and a sensing operation on memory cells is performed based on a current read voltage at step S120.

Subsequently, it is determined whether a read operation has succeeded as a result of the sensing operation at step S130. In the step S130, a reference for determining whether the read operation has succeeded may be determined based on, for example, an error detection result using an error correction code (ECC). In this case, when only an error that is correctable is included as the result of the sensing operation, it may be determined that a read operation on a corresponding page has succeeded.

When the read operation succeeds (that is, "YES" at step S130), the read operation on the corresponding page may end. In this case, a read voltage when the read operation succeeds is determined as the optimum read voltage.

When the read operation fails (that is, "NO" at step S130), it is determined whether the number of times that the read operation of the corresponding page has failed has reached a critical value at step S140.

When the read operation continuously fails even though the sensing operation is repeatedly performed, and the number of times that the read operation of the corresponding page has failed reaches a certain critical value (that is, "YES" at step S140), this is finally determined as a read failure, and the read operation ends.

When the number of times that the read operation of the corresponding page has failed has not yet reach the critical value (that is, "NO" at step S140), the read voltage is changed at step S150, and the sensing operation on memory cells is performed once again at step S120. As such processes are repeated, an optimum read voltage can be detected through a plurality of read voltages R1 to R5 as shown in FIG. 6.

The steps S120, S130, S140, and S150 are repeatedly performed within a limit, which may be the maximum allowable number of times that the read operation of the corresponding page has failed (i.e., the critical value). As described above, a process of repeating threshold voltage sensing by changing the read voltage is referred to as read retry. Also, in order to change the read voltage in the step S150, a plurality of read voltages may be stored in a read retry table (RRT) for reference. That is, whenever the step S150 is repeatedly performed, the read voltage may be changed with reference to the RRT.

As described above, as bit errors are detected by repeatedly detecting threshold voltages of memory cells, using the plurality of read voltages R1 to R5, the fourth read voltage R4 may be determined as the optimum read voltage. However, according to the process of detecting the threshold voltages of the memory cells, using the plurality of read voltages R1 to R5, the time required to determine the optimum read voltage increases.

In the read operation of the semiconductor memory device according to an embodiment of the present disclosure, when it is determined that different reference currents are used in the page buffer circuit, it is possible to obtain an effect as if different read voltages are applied. Accordingly, the optimum read voltage can be determined by performing the threshold voltage sensing only once.

Figure 8:
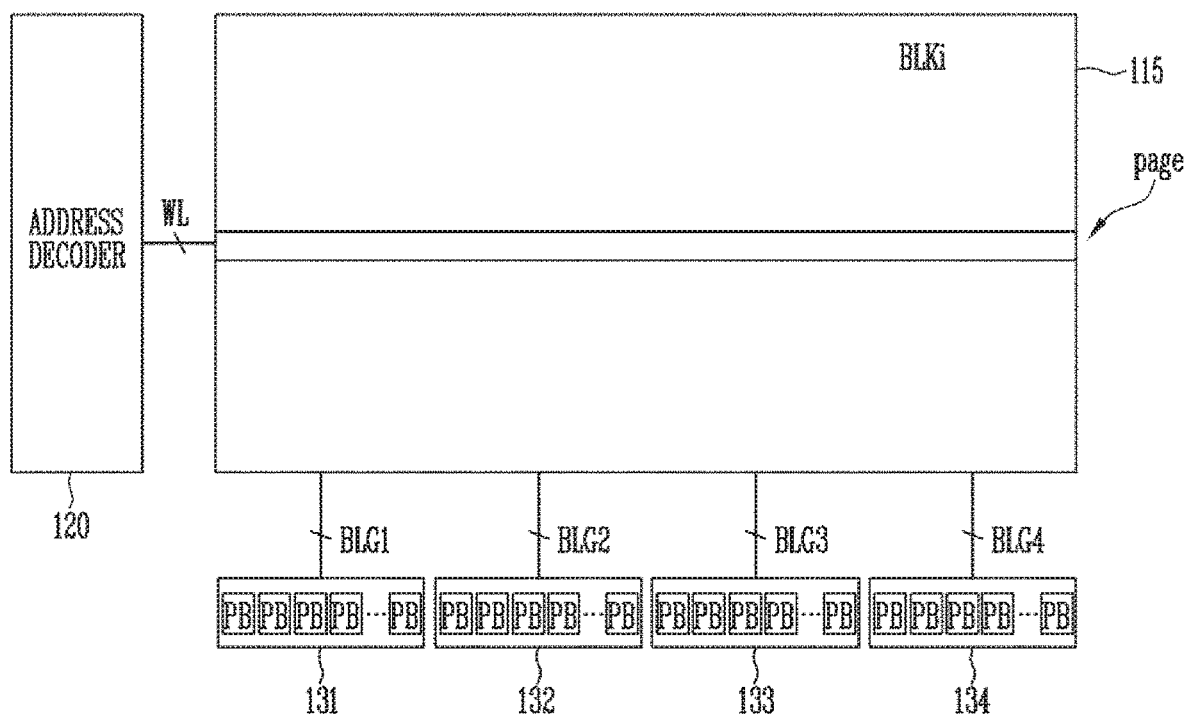
FIG. 8 is a block diagram illustrating a read operation of the semiconductor memory device according to an embodiment of the present disclosure.

FIG. 8 is a block diagram illustrating a read operation of the semiconductor memory device according to an embodiment of the present disclosure.

Referring to FIG. 8, among the components of the semiconductor memory device 100 shown in FIG. 1, a memory block BLKi 115 included in the memory cell array 110 and the address decoder 120 are shown for illustrative purposes. In addition, page buffer circuits 131, 132, 133, and 134 respectively coupled to bit line groups BLG1, BLG2, BLG3, and BLG4 are illustrated. As described above, the memory block 115 is coupled to the address decoder 120 through a word line WL. The address decoder 120 performs a read operation by applying a read voltage to a word line coupled to a selected page and applying a read pass voltage to the other word lines. Each of the page buffer circuits 131, 132, 133, and 134 may include a plurality of page buffers PB. The page buffers PB may respectively correspond to the plurality of page buffers PB1 to PBm shown in FIG. 1. In an embodiment, the same number of page buffers PB may be included in each of the page buffer circuits 131, 132, 133, and 134. In another embodiment, the page buffer circuits 131, 132, 133 may include different numbers of page buffers PB.

A first bit line group BLG1 is coupled to a first page buffer circuit 131, and a second bit line group BLG2 is coupled to a second page buffer circuit 132. Similarly, a third bit line group BLG3 is coupled to a third page buffer circuit 133, and a fourth bit line group BLG4 is coupled to a fourth page buffer circuit 134. Bit lines of the first bit line group BLG1 may be respectively coupled to the page buffers PB in the first page buffer circuit 131. Bit lines of the second bit line group BLG2 may be respectively coupled to the page buffers PB in the second page buffer circuit 132. Bit lines of the third bit line group BLG3 may be respectively coupled to the page buffers PB i in the third page buffer circuit 133. Bit lines of the fourth bit line group BLG4 may be respectively coupled to the page buffers PB in the fourth page buffer circuit 134.

The first page buffer circuit 131 senses threshold voltages of memory cells coupled to the first bit line group BLG1, based on a first reference current Itrip1. Specifically, each of the page buffers PB in the first page buffer circuit 131 senses a threshold voltage of a memory cell coupled to a corresponding bit line, based on Itrip1. The second page buffer circuit 132 senses threshold voltages of memory cells coupled to the second bit line group BLG2, based on a second reference current Itrip2. Specifically, each of the page buffers PB in the second page buffer circuit 132 senses a threshold voltage of a memory cell coupled to a corresponding bit line, based on Itrip2. The third page buffer circuit 133 senses threshold voltages of memory cells coupled to the third bit line group BLG3, based on a third reference current Itrip3. Specifically, each of the page buffers PB in the third page buffer circuit 133 senses a threshold voltage of a memory cell coupled to a corresponding bit line, based on Itrip3. The fourth page buffer circuit 134 senses threshold voltages of memory cells coupled to the fourth bit line group BLG4, based on a fourth reference current Itrip4. Specifically, each of the page buffers PB in the fourth page buffer circuit 134 senses a threshold voltage of a memory cell coupled to a corresponding bit line, based on Itrip4.

As a result, the page data may be divided to four subpage data. The first subpage data is sensed by page buffer circuit 131 using the reference current Itrip1. The second subpage data is sensed by page buffer circuit 132 using the reference current Itrip2. The third subpage data is sensed by page buffer circuit 133 using the reference current Itrip3. The fourth subpage data is sensed by page buffer circuit 134 using the reference current Itrip4.

Even when the same read voltage is applied to the word lines, as it is determined that different reference currents are used in the page buffer circuit, it is possible to obtain an effect as if different read voltages are applied. This will be described with reference to FIGS. 9 and 10.

Figure 9:
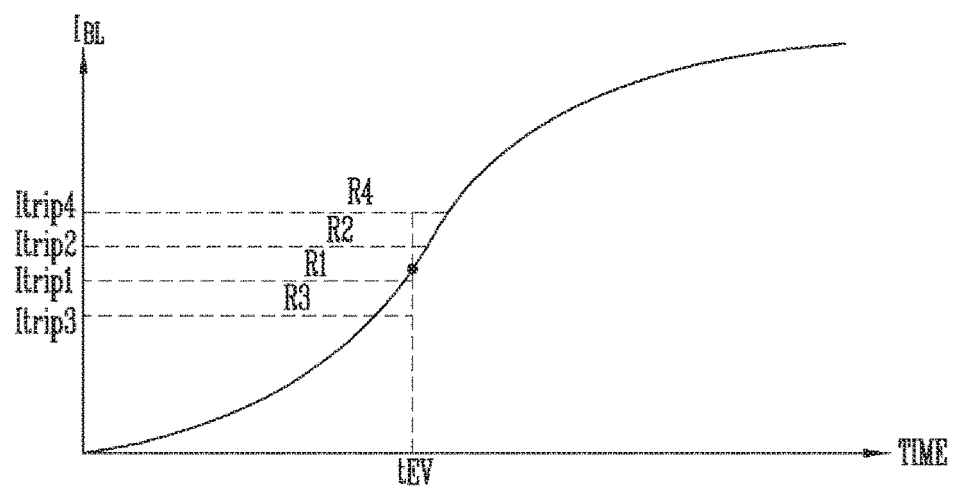
FIG. 9 is a graph illustrating a method for performing a read operation, using different reference currents, according to an embodiment of the present disclosure.

FIG. 9 is a graph illustrating a method for performing a read operation, using different reference currents, according to an embodiment of the present disclosure. Specifically, FIG. 9 illustrates a graph of bit line current $I_{BL}$ with respect to time TIME in a sensing operation on a specific memory cell. In FIG. 9, there is illustrated an effect when a threshold voltage of a selected memory cell is sensed using different reference currents.

Referring to FIG. 9, a bit line current $I_{BL}$ at a certain evaluation time tEV is determined on a curve. As the measured bit line current $I_{BL}$ is compared with a reference current, it is determined whether the memory cell is an on-cell or off-cell. When the sensing operation is performed using a first reference current Itrip1, the bit line current $I_{BL}$ has a value larger than that of the first reference current Itrip1, and hence the memory cell may be determined as an on-cell. When the sensing operation is performed using a second reference current Itrip2, the bit line current $I_{BL}$ has a value smaller than that of the second reference current Itrip2, and hence the memory cell may be determined as an off-cell. When the sensing operation is performed using a third reference current Itrip3, the bit line current $I_{BL}$ has a value larger than that of the third reference current Itrip3, and hence the memory cell may be determined as an on-cell. When the sensing operation is performed using a fourth reference current Itrip4, the bit line current $I_{BL}$ has a value smaller than that of the fourth reference current Itrip4, and hence the memory cell may be determined as an off-cell.

As described above, when different reference currents are applied, the same memory cell may be determined as an on-cell or off-cell. That is, as different reference currents are applied, it is possible to obtain an effect as if the read voltage is adjusted. Accordingly, when the sensing operation is performed using the first reference current Itrip1, it is as if the sensing operation is performed using the first read voltage R1. When the sensing operation is performed using the second reference current Itrip2, it is as if the sensing operation is performed using the second read voltage R2. When the sensing operation is performed using the third reference current Itrip3, it is as if the sensing operation is performed using the third read voltage R3. When the sensing operation is performed using the fourth reference current Itrip4, it is as if the sensing operation is performed using the fourth read voltage R4.

Figure 10:
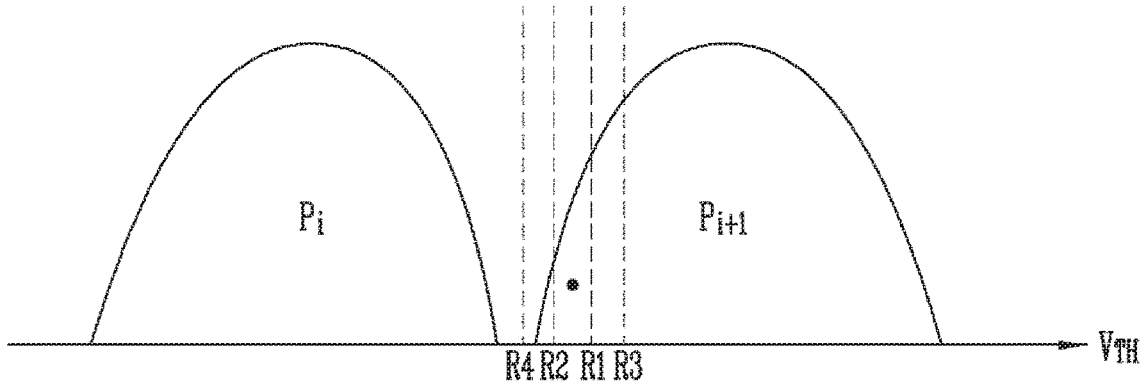
FIG. 10 is another graph illustrating a method for performing a read operation, using different reference currents, according to an embodiment of the present disclosure.

FIG. 10 is another graph illustrating a method for performing a read operation, using different reference currents, according to an embodiment of the present disclosure.

Referring to FIG. 10, an effect that occurs when different reference currents are used, as described in FIG. 9, is illustrated. In FIG. 10, a situation in which a read operation is performed using a read voltage between an ith program state $P_i$ and an (i+1)th program state $P_{i+1}$ is illustrated.

As described above, when a read operation is performed using different reference currents Itrip1, Itrip2, Itrip3, and Itrip4, this has the same effect as a read operation being performed using different read voltages R1, R2, R3, and R4. In FIG. 10, for a memory cell indicated by a black spot, a sensing operation is performed using different reference currents Itrip1, Itrip2, Itrip3, and Itrip4 as shown in FIG. 9. When the sensing operation is performed using the first reference current Itrip1 as shown in FIG. 9, a corresponding memory cell is determined as an on-cell. As shown in FIG. 10, this has the same effect as the sensing operation being performed on the corresponding memory cell, using the first read voltage R1. In addition, when the sensing operation is performed using the second reference current Itrip2 as shown in FIG. 9, a corresponding memory cell is determined as an off-cell. As shown in FIG. 10, this has the same effect as the sensing operation being performed on the corresponding memory cell, using the second read voltage R2. When the sensing operation is performed using the third reference current Itrip3 as shown in FIG. 9, a corresponding memory cell is determined as an on-cell. As shown in FIG. 10, this has the same effect as the sensing operation being performed on the corresponding memory cell, using the third read voltage R3. In addition, when the sensing operation is performed using the fourth reference current Itrip4 as shown in FIG. 9, a corresponding memory cell is determined as an off-cell. As shown in FIG. 10, this has the same effect as the sensing operation being performed on the corresponding memory cell, using the fourth read voltage R4.

Referring to FIGS. 9 and 10 together, the semiconductor memory device 100 according to an embodiment of the present disclosure divides bit lines coupled to a selected page for a read operation into a plurality of bit line groups BLG1, BLG2, BLG3, and BLG4, which are coupled to corresponding page buffer circuits 131, 132, 133, and 134, respectively. The page buffer circuits 131, 132, 133, and 134 perform sensing operations, using different reference currents Itrip1, Itrip2, Itrip3, and Itrip4, respectively. Specifically, the page buffers PB in the first page buffer circuit 131 performs a sensing operation, using the first reference current Itrip1, and the page buffers PB in the second page buffer circuit 132 performs a sensing operation, using the second reference current Itrip2. In addition, the page buffers PB in the third page buffer circuit 133 performs a sensing operation, using the third reference current Itrip3, and the page buffers PB in the fourth page buffer circuit 134 performs a sensing operation, using the fourth reference current Itrip4. Accordingly, although a single read voltage is applied through a word line, as different reference currents are applied, it is possible to obtain the same effect as if different read voltages are applied. That is, since the first page buffer circuit 131 performs the sensing operation, using the first reference current Itrip1, it is possible to obtain the same result as the sensing operation being performed on the memory cells coupled to the first bit line group BLG1, using the first read voltage R1. Since the second page buffer circuit 132 performs the sensing operation, using the second reference current Itrip2, it is possible to obtain the same result as the sensing operation being performed on the memory cells coupled to the second bit line group BLG2, using the second read voltage R2. In addition, since the third page buffer circuit 133 performs the sensing operation, using the third reference current Itrip3, it is possible to obtain the same result as the sensing operation being performed on the memory cells coupled to the third bit line group BLG3, using the third read voltage R3. Since the fourth page buffer circuit 134 performs the sensing operation, using the fourth reference current Itrip4, it is possible to obtain the same result as the sensing operation being performed on the memory cells coupled to the fourth bit line group BLG4, using the fourth read voltage R4.

According to FIGS. 8 to 10, the fourth page buffer circuit 134 performs the sensing operation on the memory cells coupled to the fourth bit line group BLG4, using the fourth reference current Itrip4, which corresponds to the fourth read voltage R4. As shown in FIG. 10, when threshold voltage sensing of memory cells is performed using the fourth read voltage R4, no bit error occurs. That is, sensing data output by the fourth page buffer circuit 134 may not include any bit error. Accordingly, the fourth read voltage R4 among the read voltages R1 to R4 can be determined as an optimum read voltage.

As described above, since the semiconductor memory device 100 according to an embodiment of the present disclosure groups the bit lines and performs the sensing operation, using different reference currents Itrip1, Itrip2, Itrip3, and Itrip4, as the sensing operation is performed only once, it is possible to obtain an effect as if the read operation is performed by applying different read voltages R1, R2, R3, and R4 to the respective bit line groups BLG1, BLG2, BLG3, and BLG4. Accordingly, the time required to determine an optimum read level can be reduced, and thus the read speed of the semiconductor memory device can be enhanced.

Figure 11:
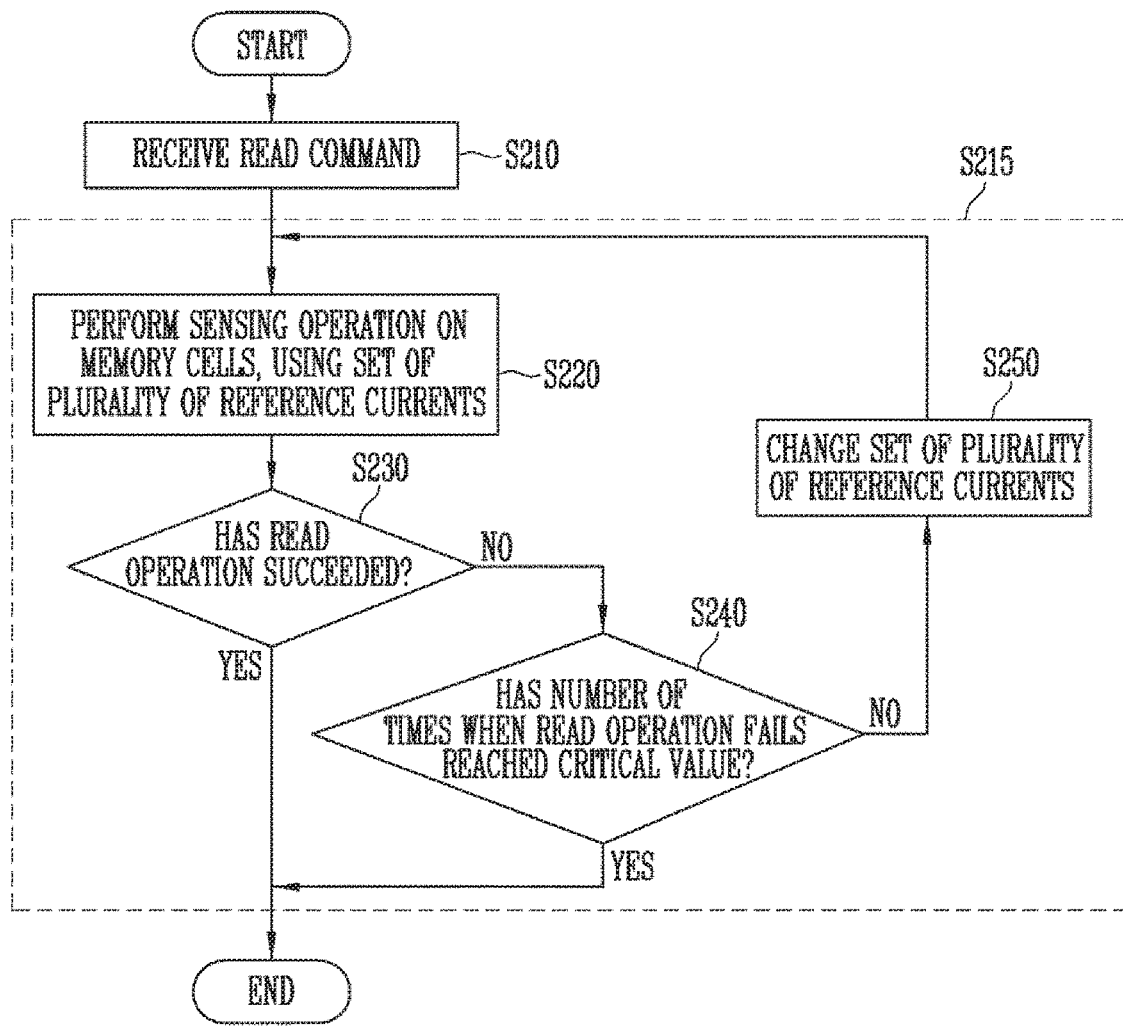
FIG. 11 is a flowchart describing a method for operating the semiconductor memory device according to an embodiment of the present disclosure.

FIG. 11 is a flowchart describing a method for operating the semiconductor memory device according to an embodiment of the present disclosure. That is, an operation of the semiconductor memory device, which is described with reference to FIGS. 8 to 10 is illustrated.

Referring to FIG. 11, a read command is received at step S210, and a sensing operation on memory cells is performed using a set of reference currents at step S220. The set of reference currents may be reference currents for detecting an optimum read voltage between adjacent program states $P_i$ and $P_{i+1}$ as shown in FIG. 10. For example, the set of reference currents may be the reference currents Itrip1, Itrip2, Itrip3, and Itrip4 shown in FIG. 9. The page data read at step S220 may be divided to four subpage data. The first subpage data is sensed by page buffer circuit 131 using the reference current Itrip1. The second subpage data is sensed by page buffer circuit 132 using the reference current Itrip2. The third subpage data is sensed by page buffer circuit 133 using the reference current Itrip3. The fourth subpage data is sensed by page buffer circuit 134 using the reference current Itrip4.

In step S230, it is determined whether a read operation has succeeded. In the step S230, a reference for determining whether the read operation has succeeded may be determined based on, for example, an error detection result using an error correction code (ECC). The first to fourth subpage data may be decoded by the ECC. In this case, when only an error that is correctable is included as the result of the sensing operation, it may be determined that a read operation on a corresponding page has succeeded. For example, it may be determined that the read operation of the fourth subpage data has succeeded among the first to fourth subpage data, as shown in FIG. 10. This means that the read operation has succeeded using the fourth reference current Itrip4 among the set of reference currents Itrip1, Itrip2, Itrip3, and Itrip4. In this example, the fourth read voltage R4 corresponding to the fourth reference current Itrip4 may be determined as the optimum read voltage. Therefore, the reference current of the page buffer circuits 131 to 134 may be changed to Itrip4 in step S250.

When the read operation succeeds (that is, "YES" at step S230), the read operation on the corresponding page may end.

When the read operation fails as a result of the determination at step S230 (that is, "NO" at step S230), it is determined whether the number of times when the read operation of the corresponding page fails has reached a critical value at step S240.

When the read operation continuously fails even though the sensing operation is repeatedly performed, and the number of times that the read operation of the corresponding page has failed reaches the critical value (that is, "YES" at step S240), this is finally determined as a read failure, and the read operation ends.

When the number of times when the read operation of the corresponding page has failed has not yet reached the critical value (that is, "NO" at step S240), the set of reference currents Itrip1, Itrip2, Itrip3, and Itrip4 is changed at step S250, and the sensing operation on memory cells is performed once again at step S220.

The steps S220, S230, S240, and S250 are repeatedly performed within a limit, which may be the maximum allowable number of times that the read operation of the corresponding page has failed (i.e., the critical value). Step S215 includes the steps S220, S230, S240, and S250. Since the optimum read voltage is detected while the set of reference currents is being changed as the sensing operation is repeated, the step S215 may be referred to as a read operation through a "process of repeatedly performing the sensing operation."

As described above, threshold voltage sensing corresponding to a plurality of read voltages is possible even when the sensing operation is performed only once. Thus, the optimum read voltage can be rapidly determined even when the sensing operation is performed a low number of times. That is, in the read operation of the semiconductor memory device according to an embodiment of the present disclosure, as it is determined that different reference currents are used in the page buffer circuit, it is possible to obtain an effect as if different read voltages are applied. Accordingly, the optimum read voltage can be determined by performing the threshold voltage sensing only once.

Figure 12:
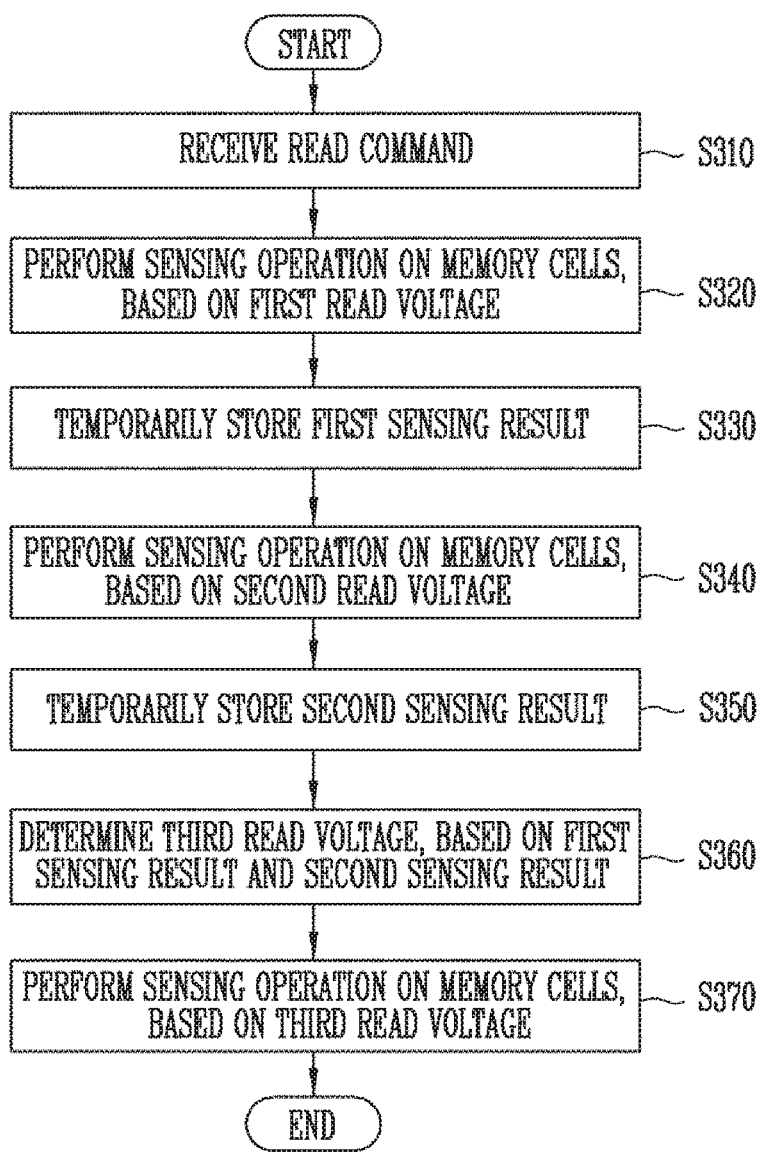
FIG. 12 is a flowchart describing a method for determining an optimum read voltage by comparing sensing results according to an embodiment of the present disclosure.
Figure 13:
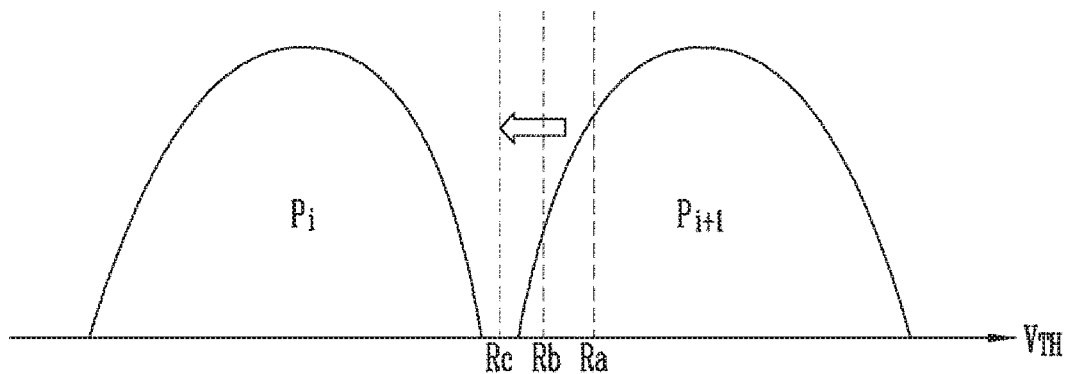
FIG. 13 is a diagram illustrating the method of FIG. 12.

FIG. 12 is a flowchart describing a method for determining an optimum read voltage by comparing sensing results according to an embodiment of the present disclosure. FIG. 13 is a diagram illustrating the method of FIG. 12.

Referring to FIG. 12, according to a method for determining an optimum read voltage by comparing sensing results, a read command is received at step S310, and a sensing operation on memory cells is performed based on a first read voltage at step S320. As an example, the sensing operation on the memory cells may be performed based on a first read voltage Ra as shown in FIG. 13.

Subsequently, a first sensing result is temporarily stored at step S330. The first sensing result is a result obtained by performing the sensing operation, using the first read voltage Ra, and may be information including a quantity of bit errors. As shown in FIG. 13, a plurality of bit errors may occur, which is the result obtained by performing the sensing operation using the first read voltage Ra.

Subsequently, a sensing operation on the memory cells is performed based on a second read voltage at step S340. As an example, the sensing operation on the memory cells may be performed based on a second read voltage Rb different from the first read voltage Ra as shown in FIG. 13.

Subsequently, a second sensing result is temporarily stored at step S350. The second sensing result is obtained by performing the sensing operation, using the second read voltage Rb, and may be information including a quantity of bit errors. As shown in FIG. 13, the number of bit errors that occur, which is the result obtained by performing the sensing operation using the second read voltage Rb, may be smaller than that of bit errors that occur, which is the result obtained by performing the sensing operation using the first read voltage Ra.

Subsequently, a third read voltage is determined based on the first sensing result and the second sensing result at step S360. Referring to FIG. 13, since the number of bit errors when the sensing operation is performed using the second read voltage Rb is smaller than that of bit errors when the sensing operation is performed using the first read voltage Ra, it can be predicted that a relatively small read voltage will be the optimum read voltage. Thus, in the step S360, a third read voltage Rc capable of decreasing the number of bit errors is determined by comparing the first sensing result using the first read voltage Ra and the second sensing result using the second read voltage Rb.

Subsequently, a sensing operation on memory cells included in a selected page is performed based on the determined third read voltage Rc at step S370. The determined third read voltage Rc is the optimum read voltage determined according to a "process of comparing sensing results."

As described above, the optimum read voltage can be determined by comparing sensing results obtained based on the sensing operation performed twice. However, in this case, an individual sensing operation is to be repeatedly performed as shown in FIG. 12, and therefore, the time required to determine the optimum read voltage is increased.

In the read operation of the semiconductor memory device according to an embodiment of the present disclosure, when it is determined that different reference currents are used in the page buffer circuit, it is possible to obtain an effect as if different read voltages are applied. Accordingly, the optimum read voltage can be determined by performing the threshold voltage sensing only once.

Figure 14:
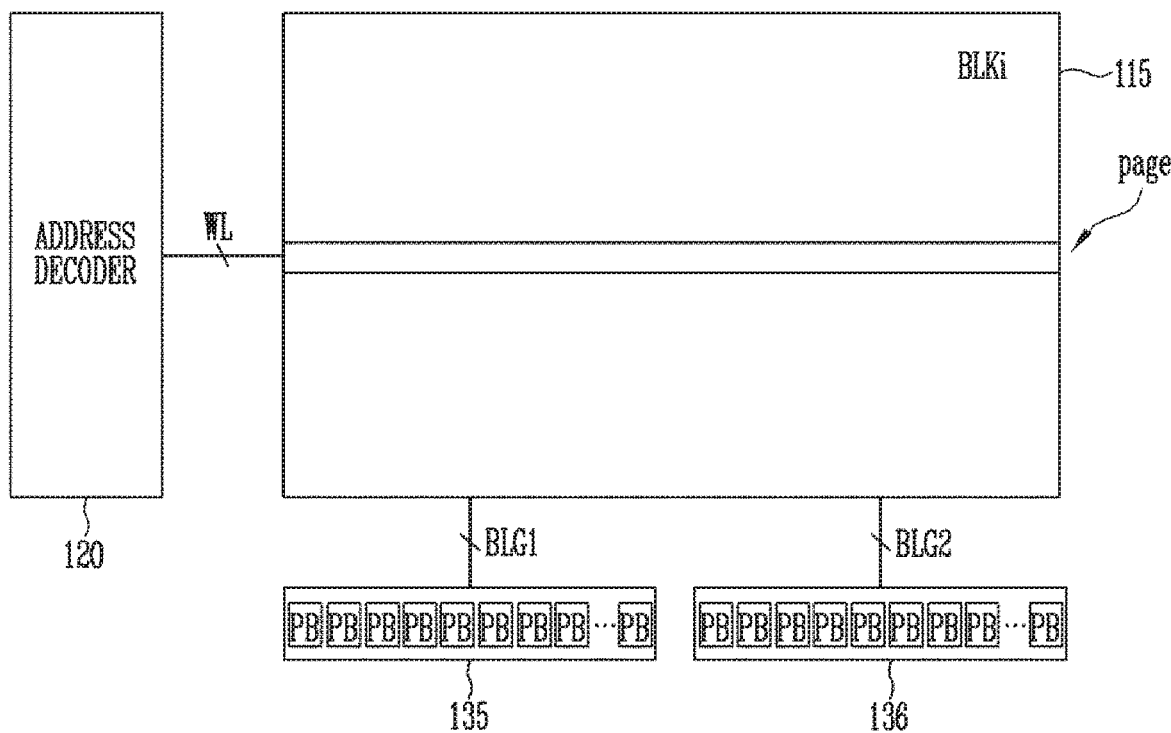
FIG. 14 is a block diagram illustrating a read operation of the semiconductor memory device according to an embodiment of the present disclosure.

FIG. 14 is a block diagram illustrating a read operation of the semiconductor memory device according to an embodiment of the present disclosure.

Referring to FIG. 14, among the components of the semiconductor memory device 100 shown in FIG. 1, a memory block BLKi 115 in the memory cell array 110 and the address decoder 120 are illustrated. In addition, page buffer circuits 135 and 136 respectively coupled to bit line groups BLG1 and BLG2 are illustrated. As described above, the memory block 115 is coupled to the address decoder 120 through a word line WL. The address decoder 120 performs a read operation by applying a read voltage to a word line coupled to a selected page and applying a read pass voltage to the other word lines. Each of the page buffer circuits 135 and 136 may include a plurality of page buffers PB. The page buffers PB in the page buffer circuits 135 and 136 may respectively correspond to the plurality of page buffers PB1 to PBm shown in FIG. 1. In an embodiment, each of the page buffer circuits 135 and 136 may include the same number of page buffers PB. In another embodiment, the number of page buffers PB in the page buffer circuits 135 and 136 may be different.

A first bit line group BLG1 is coupled to a first page buffer circuit 135, and a second bit line group BLG2 is coupled to a second page buffer circuit 136. The first page buffer circuit 135 senses threshold voltages of memory cells coupled to the first bit line group BLG1, based on a first reference current Itrip1. Specifically, each of the page buffers PB in the first page buffer circuit 135 senses a threshold voltage of a memory cell coupled to a corresponding bit line, based on Itrip1. The second page buffer circuit 136 senses threshold voltages of memory cells coupled to the second bit line group BLG2, based on a second reference current Itrip2. Specifically, each of the page buffers PB in the second page buffer circuit 136 senses a threshold voltage of a memory cell coupled to a corresponding bit line, based on Itrip2. The page data may be divided to two subpage data. The first subpage data is sensed by page buffer circuit 135 using the reference current Itrip1. The second subpage data is sensed by page buffer circuit 136 using the reference current Itrip2.

Even when the same read voltage is applied to the word lines, as it is determined that different reference currents are used in the page buffer circuit, it is possible to obtain an effect as if different read voltages are applied. This has been described with reference to FIGS. 9 and 10, and therefore, overlapping description is omitted here.

Referring to FIGS. 13 and 14 together, the first reference current Itrip1 may correspond to a first reference voltage Ra. In addition, the second reference current Itrip2 may correspond to a second reference voltage Rb. Accordingly, it is sensed whether threshold voltages of memory cells coupled to a bit line of the first bit line group BLG1 are larger than the first reference voltage Ra, and it is sensed whether threshold voltages of memory cells coupled to a bit line of the second bit line group BLG2 are larger than the second reference voltage Rb. That is, the semiconductor memory device according to an embodiment of the present disclosure performs threshold voltage sensing corresponding to a plurality of read voltages, using different reference currents Itrip1 and Itrip2. Accordingly, sensing corresponding to a plurality of read voltages can be performed by performing the threshold voltage sensing only once. Consequently, it is possible to more rapidly detect an optimum read voltage.

Figure 15:
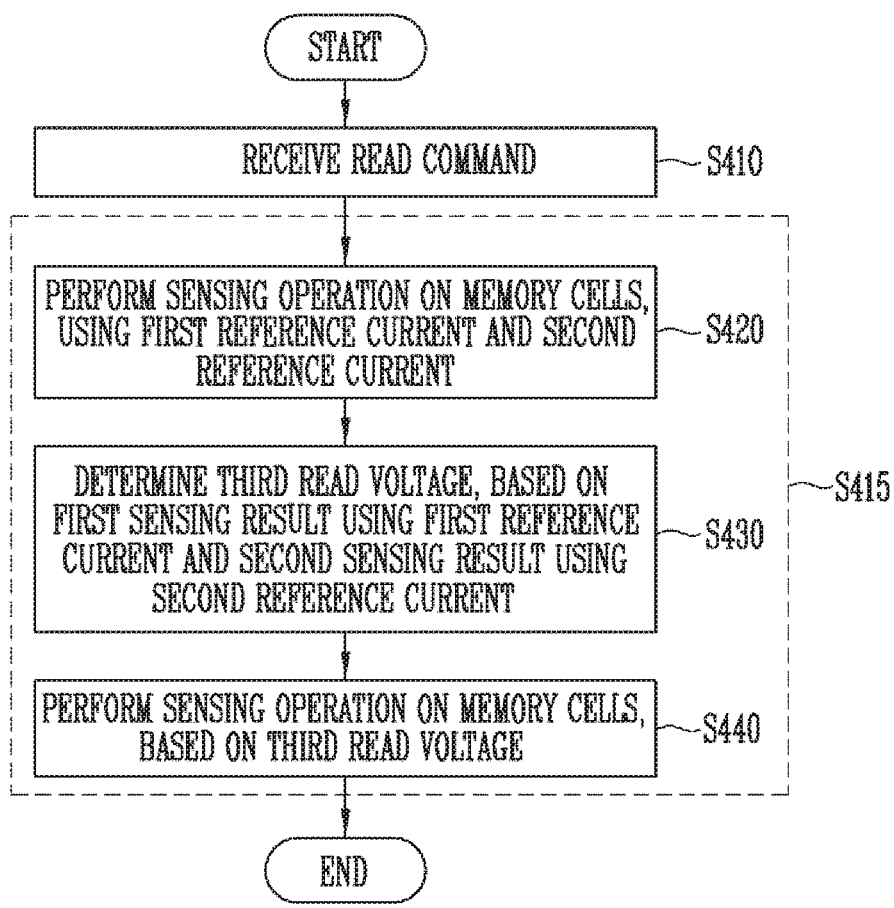
FIG. 15 is a flowchart describing a method for operating the semiconductor memory device according to another embodiment of the present disclosure.

FIG. 15 is a flowchart describing a method for operating the semiconductor memory device according to another embodiment of the present disclosure. That is, FIG. 15 illustrates an operation of the semiconductor memory device that is described in FIG. 14.

Referring to FIG. 15, a read command is received at step S410, and a sensing operation on memory cells is performed using a first reference current Itrip1 and a second reference current Itrip2 at step S420.

In the step S420, for example, as described with reference to FIGS. 13 and 14, a sensing operation on threshold voltages of memory cells coupled to the first bit line group BLG1 is performed using the first reference current Itrip1, and a sensing operation on threshold voltages of memory cells coupled to the second bit line group BLG2. Accordingly, sensing using a first read voltage Ra corresponding to the first reference current Itrip1 and sensing using a second read voltage Rb corresponding to the second reference current Itrip2 are simultaneously performed.

Subsequently, in step S430, a third read voltage is determined based on a first sensing result using the first reference current Itrip1 and a second sensing result using a second reference current Itrip2. As shown in FIG. 13, the number of bit errors that occur as the first sensing result using the first reference current Itrip1 is larger than that of bit errors that occur as the second sensing result using the second reference current Itrip2. Accordingly, a voltage smaller than the second read voltage Rb corresponding to the second reference current Itrip2 may be determined as a third read voltage Rc. The determined read voltage is an optimum read voltage determined according to a "process of comparing sensing results."

Subsequently, in step S440, a sensing operation on memory cells is performed based on the determined third read voltage. For example, the page buffer circuits 135 and 136 sense the page data using the determined third read voltage.

In FIG. 15, step S415 illustrates a sensing operation on memory cells according to the "process of comparing sensing results." As shown in FIG. 15, the step S415 includes the steps S420, S430, and S440.

As shown in FIG. 15, in the method according to an embodiment of the present disclosure, threshold voltage sensing corresponding to a plurality of read voltages is performed using different reference currents in the step S420. Accordingly, sensing corresponding to a plurality of read voltages can be performed by performing the threshold voltage sensing only once. Consequently, it is possible to more rapidly detect an optimum read voltage.

Figure 16:
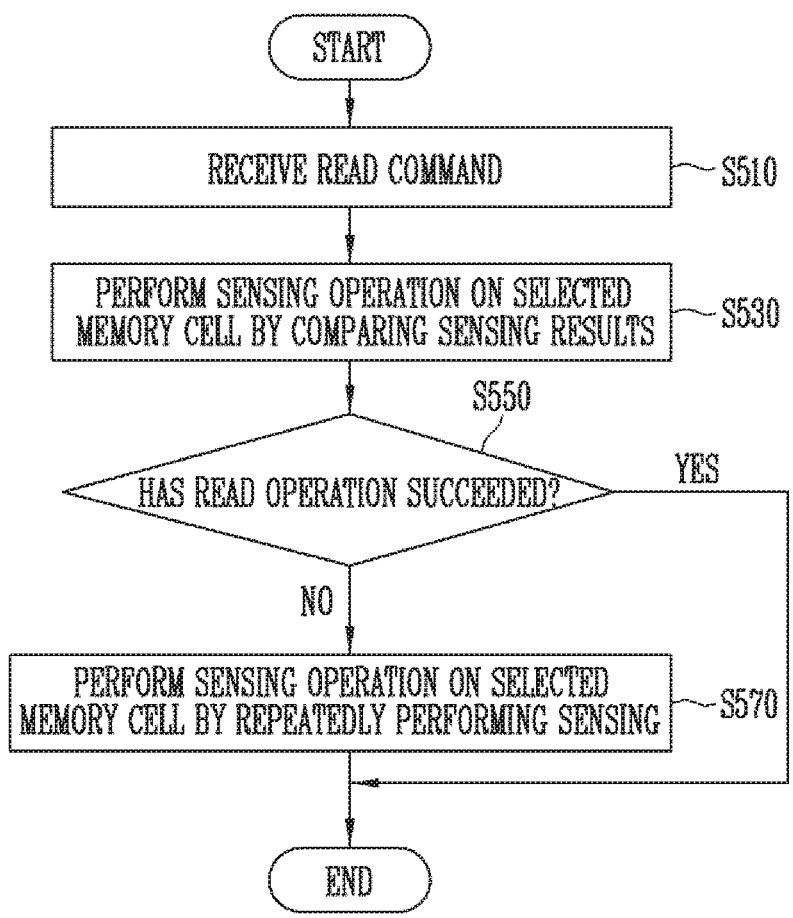
FIG. 16 is a flowchart describing a method for operating the semiconductor memory device according to another embodiment of the present disclosure.

FIG. 16 is a flowchart illustrating a method for operating the semiconductor memory device according to another embodiment of the present disclosure.

Referring to FIG. 16, the method includes a step S510 of receiving a read command, a step S530 of performing a sensing operation on a selected memory cell by comparing sensing results, a step S550 of determining whether a read operation has succeeded, and a step S570 of performing the sensing operation on the selected memory cell by repeatedly performing sensing.

In FIG. 16, the step S530 of performing a sensing operation on a selected memory cell by comparing sensing results may correspond to the step S415 shown in FIG. 15. Accordingly, in the step S530 of FIG. 16, a sensing operation on memory cells is performed using the first reference current Itrip1 and the second reference current Itrip2 at step S420, a third read voltage is determined based on a first sensing result using Itrip1 and a second sensing result using Itrip2 at step S430, and a sensing operation on memory cells is performed based on the determined third read voltage at step S440. For example, the page buffer circuits 135 and 136 may perform sensing operation using the determined third read voltage in the step S440. Accordingly, in the step S530, threshold voltage sensing corresponding to a plurality of read voltages is performed using different reference currents, and a sensing operation on memory cells is performed based on an optimum read voltage determined by comparing a plurality of sensing results.

In the step S550, when a read operation based on the determined third read voltage succeeds as a result obtained as the sensing operation on the selected memory cell is performed by comparing sensing results (that is, "YES" at step S550), a read operation corresponding to the received read command ends. When the read operation fails (that is, "NO" at step S550), the method proceeds to step S570.

In FIG. 16, the step S570 of performing the sensing operation on the selected memory cell by repeatedly performing sensing may correspond to the step S215 shown in FIG. 11. Accordingly, in the step S570 of FIG. 16, a sensing operation of memory cells is performed using a set of reference currents Itrip1 and Itrip2 at step S220, and a read operation corresponding to the received read command ends when it is determined that a read operation succeeded at step S230. When the read operation fails, it is determined whether the number of times that the read operation has failed by repeatedly performing sensing has reached a critical value at step S240, and the read operation ends when the number of times that the read operation has failed has reached the critical value. When the number of times that the read operation has failed has not yet reached the critical value, the set of reference currents is changed at step S250, and the sensing operation on memory cells is then re-performed at step S220.

As described above, in the embodiment shown in FIG. 16, after the read command is received, the sensing operation on the selected memory cell is performed by comparing sensing results at step S530. Subsequently, when the operation fails, the sensing operation on the selected memory cell is performed by repeatedly performing sensing at step S570. Accordingly, it is possible to accurately and rapidly perform a sensing operation of memory cells.

Figure 17:
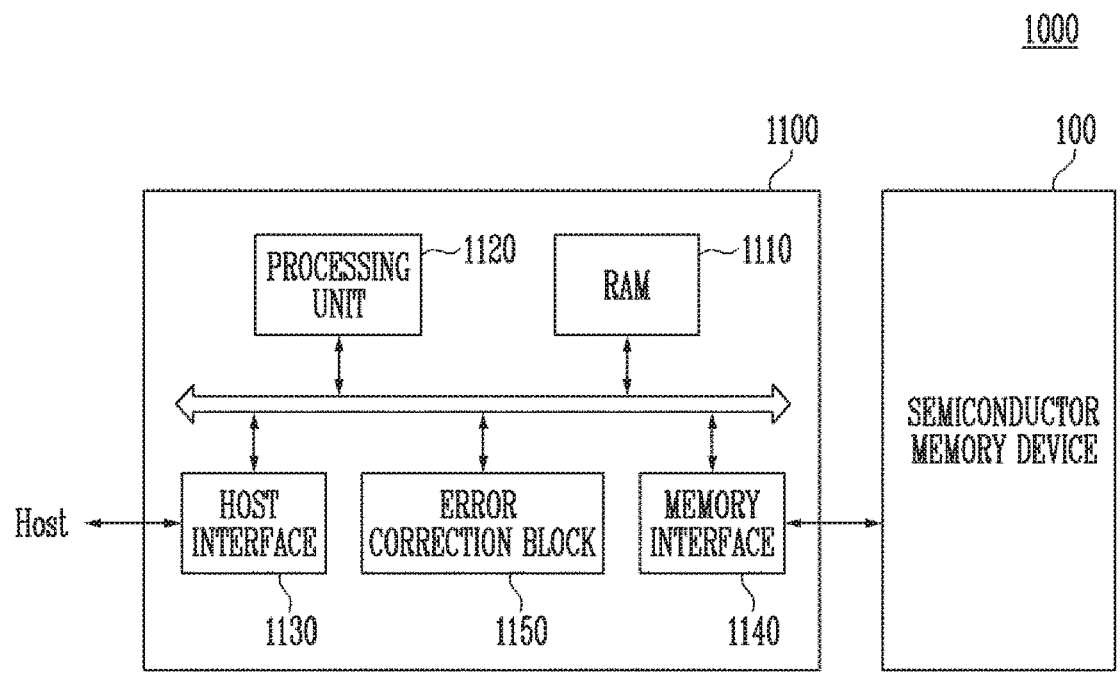
FIG. 17 is a block diagram illustrating a memory system including the semiconductor memory device of FIG. 1.

FIG. 17 is a block diagram illustrating an application example of a memory system including the semiconductor memory device of FIG. 1.

Referring to FIG. 17, the memory system 1000 includes a semiconductor memory device 100 and the controller 1100. The semiconductor memory device 100 may be the semiconductor memory device described with reference to FIG. 1.

The controller 1100 is coupled to a host (Host) and the semiconductor memory device 100. The controller 1100 is configured to access the semiconductor memory device 100 in response to a request from the host. For example, the controller 1100 is configured to control read, write, erase, and background operations of the semiconductor memory device 100. The controller 1100 is configured to provide an interface between the semiconductor memory device 100 and the host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of a working memory of the processing unit 1120, a cache memory between the semiconductor memory device 100 and the host, and a buffer memory between the semiconductor memory device 100 and the host. The processing unit 1120 controls overall operations of the controller 1100. In addition, the controller 1100 may temporarily store program data provided from the host in a write operation.

The host interface 1130 includes a protocol for exchanging data between the host and the controller 1100. In an embodiment, the controller 1100 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correction block 1150 is configured to detect and correct an error of data received from the semiconductor memory device 100 by using an error correction code (ECC). The processing unit 1120 may control the semiconductor memory device 100 to adjust a read voltage, based on an error detection result of the error correction block 1150, and to perform re-reading. In an embodiment, the error correction block 1150 may be provided as a component of the controller 1100.

The controller 1100 and the semiconductor memory device 100 may be integrated into a single semiconductor device. In an embodiment, the controller 1100 and the semiconductor memory device 100 may be so integrated to constitute a memory card such as a PC card (personal computer memory card international association (PCM-CIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into single semiconductor device to constitute a semiconductor drive (solid state drive (SSD)), which includes a storage device configured to store data in a semiconductor memory. If the memory system 1000 is used as the semiconductor drive SSD, the operating speed of the host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms. For example, the semiconductor memory device 100 or the memory system 1000 may be packaged as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), mufti chip package (MCP), wafer-level fabricated package (WFP), or wafer-level processed stack package (WSP).

Figure 18:
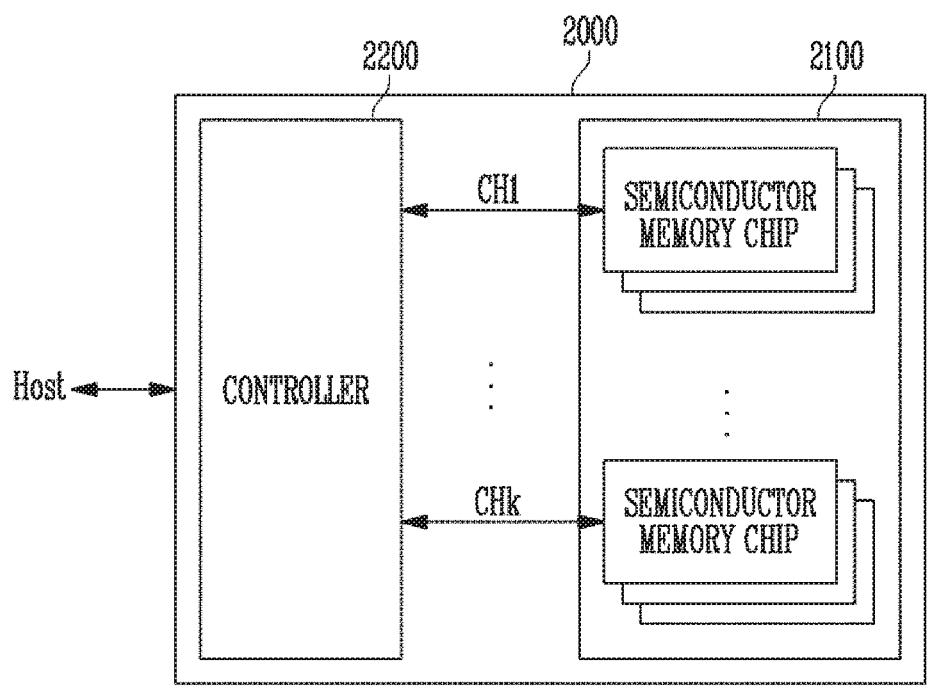
FIG. 18 is a block diagram illustrating an application example of the memory system of FIG. 17.

FIG. 18 is a block diagram illustrating an exemplary application of the memory system of FIG. 17.

Referring to FIG. 18, the memory system 2000 includes a semiconductor memory device 2100 and a controller 2200. The semiconductor memory device 2100 includes a plurality of semiconductor memory chips that are divided into a plurality of groups. In FIG. 18, it is illustrated that the plurality of groups of semiconductor memory chips communicate with the controller 2200 through first to kth channels CH1 to CHk. Each semiconductor memory chip may be configured and operated identically to the semiconductor memory device 100 described with reference to FIG. 1.

Each group of semiconductor chips is configured to communicate with the controller 2200 through one common channel. The controller 2200 may be configured similarly to the controller 1100 described with reference to FIG. 17. The controller 2200 may be configured to control the plurality of memory chips of the semiconductor memory device 2100 through the plurality of channels CH1 to CHk.

Figure 19:
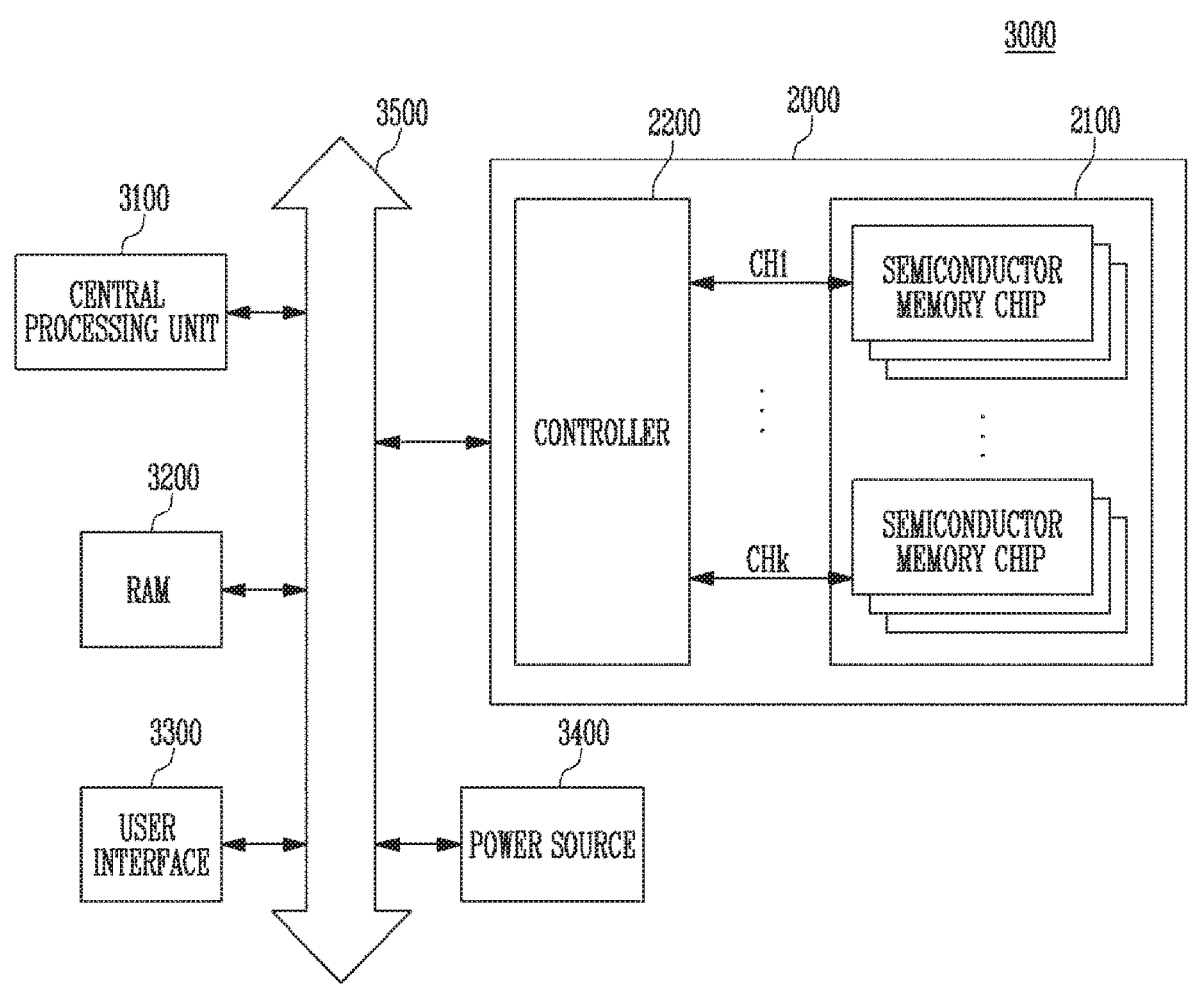
FIG. 19 is a block diagram illustrating a computing system including the memory system described with reference to FIG. 18 according to an embodiment of the present disclosure.

FIG. 19 is a block diagram illustrating a computing system including the memory system described with reference to FIG. 18 according to an embodiment of the present disclosure.

Referring to FIG. 19, the computing system 300 includes a central processing unit 3100, a RAM 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 10, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 19, it is illustrated that the memory system 2000 described with reference to FIG. 18 is provided. However, the memory system 2000 may be implemented by the memory system 1000 described with reference to FIG. 17. In an embodiment, the computing system 3000 may be configured to include both the memory systems 1000 and 2000 described with reference to FIGS. 17 and 18.

According to the present disclosure, it is possible to provide a semiconductor memory device having increased operating speed.

Further, according to the present disclosure, it is possible to provide a method for operating a semiconductor memory device at increased operating speed.

Various embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for operating a semiconductor memory device, the method comprising:
   receiving a read command;
   performing a sensing operation on a plurality of memory cells, using a set of reference currents;
   determining whether a read operation has succeeded, as a result of the sensing operation; and
   changing the set of reference currents, based on the determined result;
   wherein the changing of the set of reference currents, based on the determined result, includes:
   when the read operation fails, determining whether the number of is times that the read operation has failed has reached a predetermined critical value;
   when the number of times that the read operation has failed has not reached the critical value, changing the set of reference currents; and
   performing the sensing operation on the plurality of memory cells, 20 using the changed set of reference currents.

2. The method of claim 1, wherein the set of reference currents includes a first reference current and a second reference current,
   wherein the first reference current corresponds to a first read voltage, and the second reference current corresponds to a second read voltage different from the first read voltage.

3. A method for operating a semiconductor memory device, the method comprising:
   receiving a read command;
   performing a sensing operation on memory cells of a selected page, using a first reference current and a second reference current different from the first reference current;
   determining a third read voltage, based on a first sensing result using the first reference current and a second sensing result using the second reference current; and
   performing the sensing operation on the memory cells, based on the third read voltage.

4. The method of claim 3, wherein the first sensing result includes a number of bit errors detected as a result of the sensing operation using the first reference current, and the second sensing result includes a number of bit errors detected as a result of the sensing operation using the second reference current.

5. The method of claim 3, wherein the first reference current corresponds to a first read voltage, the second reference current corresponds to a second read voltage different from the first read voltage, and a third reference current corresponds to the third read voltage.

6. The method of claim 5, further comprising, when the sensing operation based on the third read voltage fails, performing the sensing operation on the memory cells by repeatedly performing sensing.

7. The method of claim 6, wherein the performing of the sensing operation on the memory cells by repeatedly performing sensing includes:
   performing a sensing operation on a plurality of memory cells, using a set of reference currents;
   determining whether a read operation has succeeded as a result of the sensing operation; and
   changing the set of reference currents based on the determined result.

8. The method of claim 7, wherein the changing of the set of reference currents, based on the determined result, includes:
   when the read operation fails, determining whether the number of times that the read operation has failed has reached a predetermined critical value;
   when the number of times that the read operation has failed has not reached the critical value, changing the set of reference currents; and
   performing the sensing operation on the plurality of memory cells, using the changed set of reference currents.

9. The method of claim 8, wherein the set of reference currents includes a fourth reference current and a fifth reference current different from the fourth reference current,
   wherein the fourth reference current corresponds to a fourth read voltage, and the fifth reference current corresponds to a fifth read voltage different from the fourth read voltage.

* * * * *